United States Patent [19]

Naruke

[11] Patent Number: 5,243,210
[45] Date of Patent: Sep. 7, 1993

[54] SEMICONDUCTOR MEMORY DEVICE AND MANUFACTURING METHOD THEREOF

[75] Inventor: Kiyomi Naruke, Kawasaki, Japan

[73] Assignee: Kabushiki Kaisha Toshiba, Kawasaki, Japan

[21] Appl. No.: 659,466

[22] Filed: Feb. 25, 1991

Related U.S. Application Data

[63] Continuation of Ser. No. 157,612, Feb. 19, 1988, abandoned.

[30] Foreign Application Priority Data

Feb. 21, 1987 [JP] Japan .................................. 62-38324

[51] Int. Cl.⁵ .................... H01L 29/68; H01L 29/78; H01L 29/86
[52] U.S. Cl. .................................. 257/320; 257/319; 257/321; 257/368; 257/403; 257/404
[58] Field of Search ........................... 357/23.5, 23.12; 257/315, 316, 317, 319, 320, 321, 368, 403, 404

[56] References Cited

U.S. PATENT DOCUMENTS

| | | | |
|---|---|---|---|
| 3,952,325 | 4/1976 | Beale et al. | 357/23.5 |
| 4,398,338 | 8/1983 | Tickle et al. | 357/23.5 |
| 4,402,064 | 8/1983 | Arakawa | 357/23.5 |
| 4,462,090 | 7/1984 | Iiznka | 357/23.12 |
| 4,752,912 | 6/1988 | Guterman | 357/23.5 |

FOREIGN PATENT DOCUMENTS

| | | | |
|---|---|---|---|
| 57-106079 | 7/1982 | Japan | 357/23.5 |
| 59-99760 | 6/1984 | Japan | 357/23.5 |

OTHER PUBLICATIONS

"High-Voltage Regulation and Process Considerations for High-Density 5 V-Only E²PROM's", Duane H. Oto et al., IEEE Journal of Solid State Circ., vol. SC-18 Oct. 1983.

"Analysis and Modeling of Floating-Gate EEPROM Cells", Avinoam Kolodny et al, IEEE Transaction on Electron Devices, vol. ED-33, No. 6, Jun. 1966.

*Primary Examiner*—Andrew J. James
*Assistant Examiner*—Ngan Van Ngo
*Attorney, Agent, or Firm*—Foley & Lardner

[57] ABSTRACT

A semiconductor memory device having a non-volatile memory transistor and a selection transistor formed near the non-volatile memory transistor. The channel region surface of the memory transistor is formed to have the same conductivity type with a lower density than the channel region surface of the selection transistor or opposite conductivity type so that the characteristic of the memory transistor shifts to the negative side resulting in a sufficient read margin for an erased cell even at a control voltage of 0.

2 Claims, 5 Drawing Sheets

WRITE

ERASE

WRITE

ERASE

SEMICONDUCTOR MEMORY DEVICE AND MANUFACTURING METHOD THEREOF

This application is a continuation of application Ser. No. 07/157,612, filed Feb. 19, 1988 now abandoned.

BACKGROUND OF THE INVENTION

The present invention relates to a semiconductor memory device and a method of manufacturing the same, and more particularly to an electrically erasable programmable ROM (EE PROM) cell.

A main trend of the EE PROM is the so-called floating gate type. A floating gate type EE PROM has a structure so that a thin gate oxide film on a drain (called a tunnel oxide film), a floating gate, an insulating film and a control gate are sequentially laminated, one upon another, whereby a high voltage is applied to the control gate to inject a charge in the floating gate via the tunnel oxide film. Then, a voltage is applied to the drain to draw out the charge from the floating gate to store necessary information.

A conventional floating gate type EE PROM, however, poses a problem in that a sufficient read margin after erase operation cannot be obtained with a control gate voltage of 0. Further, it also poses a problem in that read margin becomes smaller as the write/erase operations are repeated.

SUMMARY OF THE INVENTION

It is an object of the invention to provide a semiconductor memory device allowing a sufficient read margin at a control gate voltage of 0.

It is another object of the present invention to provide a semiconductor memory device maintaining a sufficient read margin even after repeated write/erase operations.

It is a further object of the present invention to provide a method of manufacturing a semiconductor memory device as above.

According to the present invention, a semiconductor memory device constructed of a non-volatile memory transistor having a first gate oxide film and a control gate formed on a semiconductor substrate and a charge storage layer formed between the control gate and the semiconductor substrate, wherein information storage is controlled a threshold value which changes in accordance with a change of charge storage state of the charge storage layer upon application of a voltage to the control gate and application of a voltage to a drain, and a selection transistor having a second gate oxide film of the same thickness as the first gate oxide film, formed on the semiconductor substrate near said memory transistor for selecting said memory transistor, is characterized in that the surface of a channel region of said memory transistor is formed to have the same conductivity type with a lower density than that of said selection transistor or to be of the opposite conductivity type.

In a semiconductor memory device of this invention, the channel region surface of the memory transistor is formed to have the same conductivity type, with a lower density than the channel region surface of the selection transistor, or to have opposite conductivity type. Therefore, the overall characteristic of the memory transistor shifts to the negative side, so that a sufficient current can be obtained after the erase operation even at a control voltage of 0, to thus ensure a sufficient read margin.

A method of manufacturing a semiconductor memory device of this invention is characterized by the steps of: forming a field oxide film on a surface of a semiconductor substrate using a selective oxidation method; forming a first oxide film on the surface of the semiconductor substrate within the area surrounded by the field oxide film, and implanting ions into the source and drain regions of a memory transistor and into the channel region of a selection transistor using a patterned resist; implanting ion into the channel region of the memory transistor for adjusting a threshold value of the memory transistor using another patterned resist, the ion being the same or opposite conductivity type with a lower density than that of the channel region of the selection transistor; after removing the first oxide film, forming a second oxide film which serves as a gate oxide film, and removing a part of the second oxide film on the memory transistor to form a third oxide film thinner than the second oxide film at the position of the removed part; depositing on the second and third oxide films a first polysilicon layer which serves as a gate electrode; patterning the first polysilicon layer; and forming a second polysilicon layer on the first polysilicon layer at least on the memory transistor with an insulating layer between the first polysilicon layer and the second polysilicon layer, the second polysilicon layer serving as a control electrode.

DESCRIPTION OF THE PREFERRED EMBODIMENT

The problem of conventional semiconductor memories will first be described with reference to the drawings.

Figure 1:
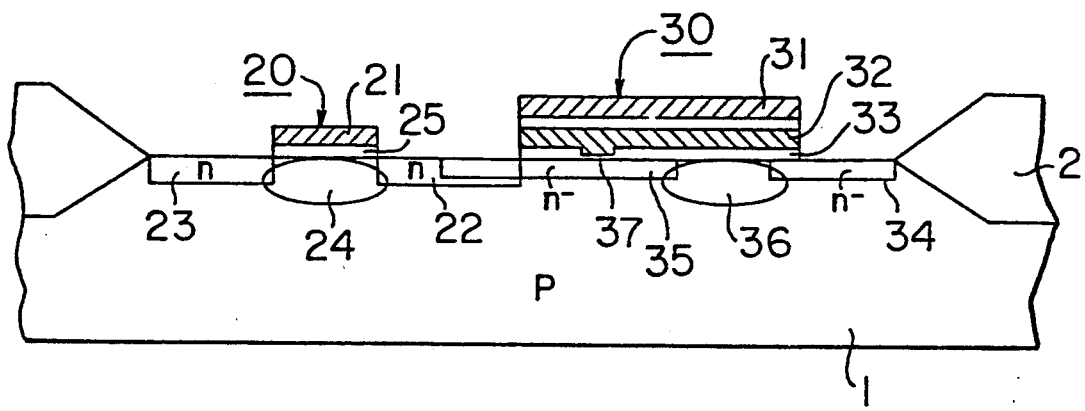
FIG. 1 is a sectional view illustrating the structure of a conventional non-volatile semiconductor memory device.

A typical cell structure of a conventional floating gate type EE PROM is shown in FIG. 1.

Referring to FIG. 1, the cell is constructed of a selection transistor 20 and a memory transistor 30 formed at the surface of a p-type semiconductor substrate 1 within a device region surrounded by a device separation field oxide film 2 formed on the substrate 1. The selection transistor 20 has an n-type drain region 22 and an n-type source region 23 facing each other with a channel region 24 interposed therebetween. A selection gate 21 is formed on the channel region 24 with a gate oxide film 25 interposed therebetween. An n$^-$-type drain region 35 and an n$^-$-region 34 of the memory transistor 30 face each other at the surface of the substrate with a channel region 36 interposed therebetween. A floating gate 32 and a control gate 31 are formed over the channel region 36 and the drain region 35 with a gate oxide film 33 interposed therebetween. The gate oxide film 33 is made thinner locally at above the drain region 35 to form a tunnel oxide film 37.

With a floating gate type EE PROM cell as above, information is stored therein by applying a high voltage to the control gate 31 and injecting electrons into the floating gate 32. Then a voltage is applied to the drain 35 to draw out charge from the floating gate 32.

Figure 2:
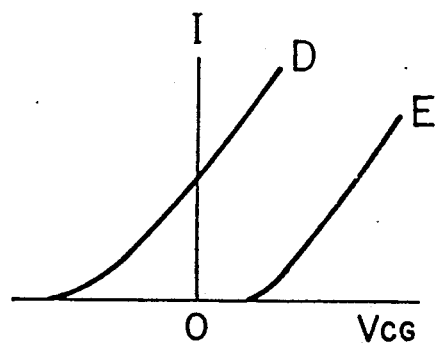
FIG. 2 is a graph showing the operating characteristics of enhancement type and depletion type transistors.

The selection transistor of the EE PROM constructed as above undergoes ion implantation for its channel region in order to have a predetermined threshold value of an enhancement type, as indicated by a letter "E" in FIG. 2. For example, in case of the n-channel transistor shown in FIG. 1, p-type impurities of boron B are implanted into the deep portion of the channel to prevent punch-through and short-channel effect and the same boron is implanted near the channel surface at a lower density, to thereby control its threshold value. The latter ion implantation into the shallow portion is effected at the same time also for the channel region of the memory transistor. Therefore, the memory transistor is also of an enhancement type having a threshold value determined by the impurity density of the substrate. An EE PROM cell as a whole may become an enhancement type or a depletion type indicated by a letter "D" in FIG. 2, depending on whether electrons are present in the floating gate of the memory transistor or not.

Figure 3A:
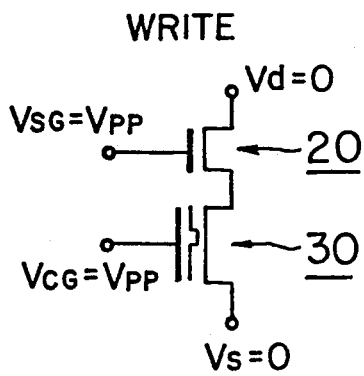
FIGS. 3A and 3B are circuit diagrams for explaining the operational problems of a conventional semiconductor memory device.
Figure 3B:
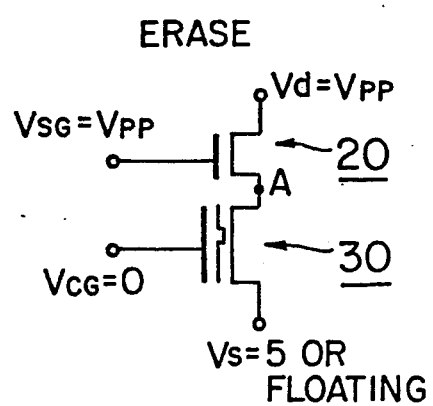

Next, the operation of such a floating gate type EE PROM will be described with reference to FIGS. 3A and 3B. FIGS. 3A and 3B illustrate write and erase operations, respectively. In FIGS. 3A and 3B, a selection transistor 20 and a memory transistor 30 are serially connected, wherein Vd represents a voltage applied to the drain of the selection transistor 20, Vs represents a voltage applied to the source of the memory transistor, $V_{SG}$ represents a voltage applied to the selection gate of the selection transistor 20, and $V_{CG}$ represents a voltage applied to the control gate of the memory transistor.

Figure 4A:
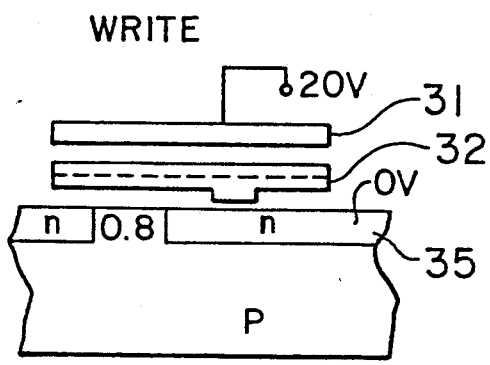
FIGS. 4A and 4B are sectional views of a conventional semiconductor memory device for illustrating the problems of its operation.
Figure 4B:
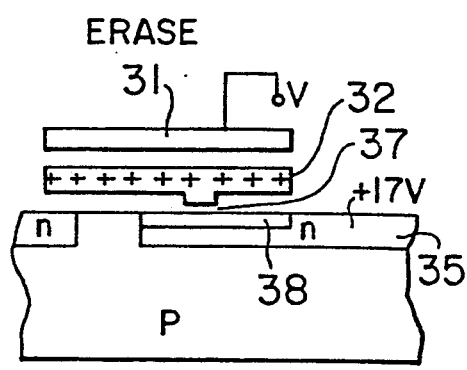

In a write operation, Vs and Vd are set at 0 V and $V_{SG}$ and $V_{CG}$ are set at Vpp, which is a program voltage usually about 20 V. With this voltage combination, electrons are injected into the floating gate 32 of the memory transistor due particularly to the function of $V_{CG}$, as shown in FIG. 4A.

On the other hand in an erase operation, Vs is set at 5 V or at a floating state, Vcc is set at 0 V, and $V_{SG}$ and Vd are set at Vpp. In this case, electrons being drawn out from the floating gate depends on the function of the drain voltage of the memory transistor indicated at A in FIG. 3B.

However, the actual voltage becomes considerably lower than Vpp. Namely, the voltage at a node A becomes about 17 V lower by about 3 V, than Vd because of a voltage drop at the selection transistor 20 and a depletion layer 38 likely to be present under the tunnel oxide film. As a result, a lower voltage is applied to the tunnel oxide film for an erase operation than for a write operation, resulting in a poor capability of electron draw-out at the erase operation as compared with the capability of electron injection at the write operation.

Figure 5:
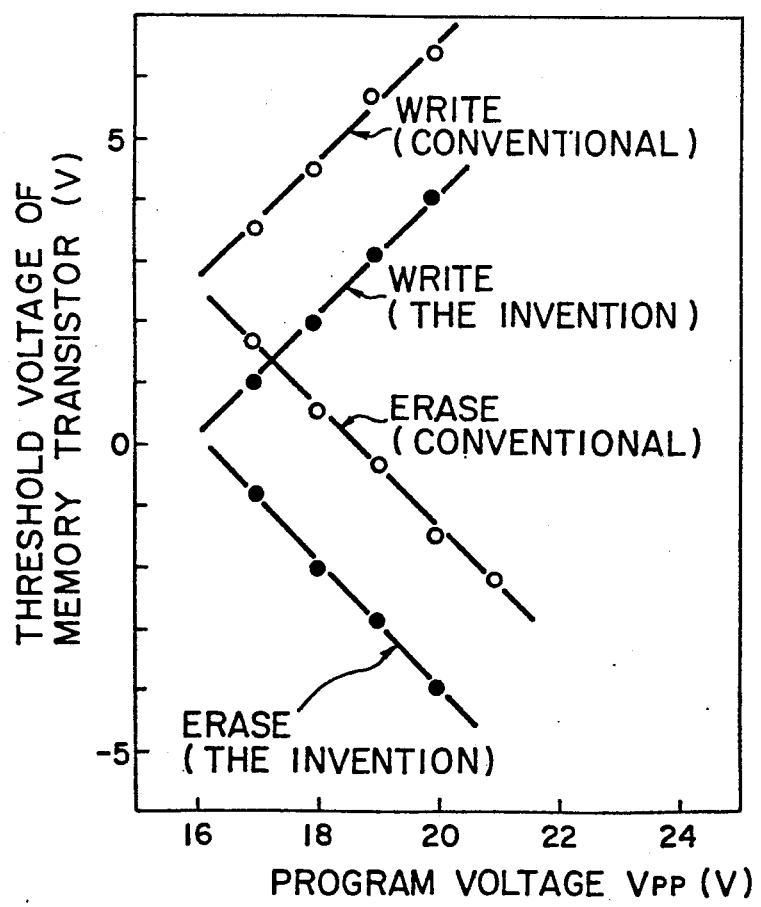
FIG. 5 is a graph showing a relation between threshold voltages at write/erase operations and a program voltage.

A memory transistor of a conventional floating gate type EE PROM is of an enhancement type so that the threshold voltages at write and erase operations vary symmetrically with respect to 2 to 3 V as shown in FIG. 5.

Figure 6:
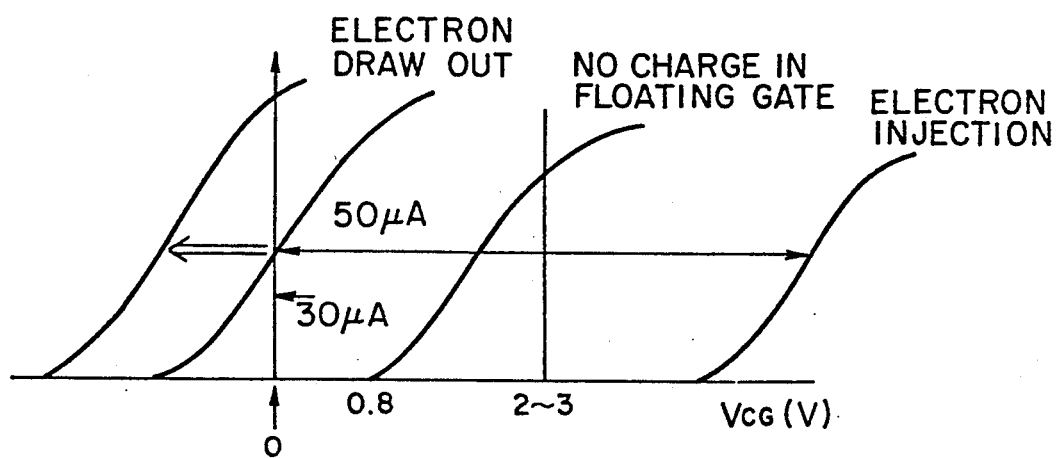
FIG. 6 is a characteristic diagram showing the problems of operation of a conventional semiconductor memory device.

In case of a read operation at the control gate voltage $V_{CG}=0$ V, although the voltage of the floating gate of an erased cell is positive, the threshold voltage Vth is not sufficiently negative. Therefore, since a smaller current than a minimum current detection value of a sense circuit of the peripheral circuit is obtained from the erased cell, it is considered that electrons have been injected into the floating gate in spite of the absence of electrons therein. Such condition is shown more clearly by the graph of FIG. 6. It is assumed that two characteristic curves shown in FIG. 6 were obtained respectively for an electron draw-out state and an electron injection state. In this case, in a read operation at $V_{CG}=0$ V, if the minimum detection current value by the sense circuit is 30 micron-ampere, the sense circuit senses a current of the erased cell, whereas if the minimum detection current value is 50 micro-ampere, it does not sen the current of the erased cell. In other words, the margin for an erased cell is not sufficient. Thus, it has been desired to move the characteristic curve for the erased cell to the left as shown by a bold arrow in FIG. 6.

A $V_{CG}$ at read out may be increased to 2–3 V to solve the above problem. However, this poses a problem that electrons once drawn out at an erase operation are again injected due to such control voltage, resulting in unreliable data storage.

To obtain an ample read margin with the control voltage=0 V, other methods may be employed such as raising Vpp to 25 V for example, or using a thinner tunnel oxide film. However, the former method requires high voltage withstanding for the memory cell structure, and the latter method poses a problem that it is difficult to obtain a thin stable oxide film so that electrons may be removed therefrom and hence reliable data storage is not ensured.

Figure 7:
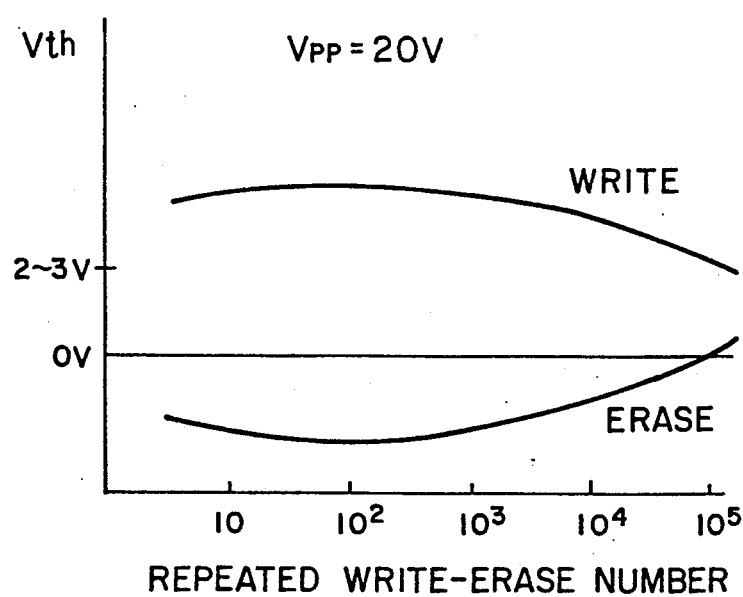
FIG. 7 is a graph showing a degraded margin after repeated write/erase operations.

Further, as shown in FIG. 7 there is a tendency that the read margin of an EE PROM cell gradually narrows because the write threshold voltage lowers and the erase threshold voltage rises as the write/erase operations at the same program voltage are repeated.

The fact that the rise of the erase threshold voltage causes the read margin of an erased cell, which is heretofore not sufficiently broad, to become even narrower, thus resulting in a memory error.

An embodiment of the present invention will be described below with reference to the drawings.

Figure 8:
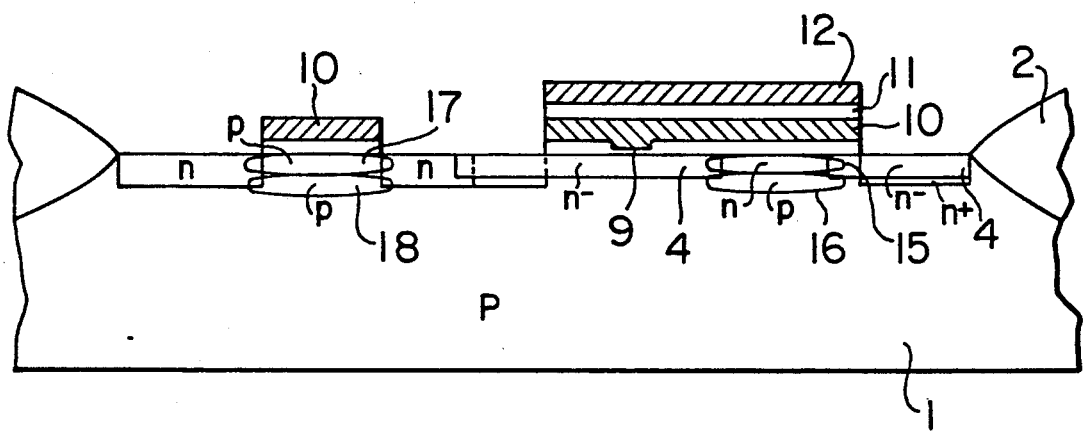
FIG. 8 is a sectional view illustrating the structure of a semiconductor memory device of this invention.

FIG. 8 is a sectional view of a cell showing an embodiment of a semiconductor memory device according to the present invention. In FIG. 8, similar to the case of a conventional device shown in FIG. 1, a selection transistor and a memory transistor are formed at the left and right sides of the drawing, respectively. Particularly, impurity diffusion layers 4 are formed in a semiconductor substrate within a device region surrounded by a field oxide film 2, with a channel region interposed therebetween. A gate electrode 10 is formed over the selection transistor and the memory transistor, with a gate insulating film interposed therebetween. The gate electrode 10 over the memory transistor constitutes a floating gate. The gate insulating film of the memory transistor is locally made thinner to form a tunnel oxide film 9, a control electrode 12 being formed on another gate insulating film 11. The channel region of the selection transistor has a p-type deep portion 18 and a p-type shallow portion 17, whereas the channel region of the memory transistor has a p-type deep portion 16 and an n-type shallow portion 15.

The selection transistor is arranged to be of an enhancement type by regulating its threshold value, whereas the memory transistor is of a depletion type with a threshold value determined by the impurity density of the substrate. Therefore, current flowing through the channel is not caused to be cut off so long as injected electrons are present in the floating gate to some degree.

FIGS. 9A to 9D are sectional views illustrating the manufacturing steps of a semiconductor memory device according to the present invention.

A p-type silicon substrate of crystalline orientation (100) is prepared to first form a field oxide film 2 at desired positions of the substrate by means of a conventional selective oxidation method. The region surrounded by the field oxide film is used as a device region or active region. Next, a sacrificed oxide film 3 about a thickness of 100 angstroms is formed on the surface of the substrate by a thermal oxidation method.

Succeedingly, a patterning process with resist coating and exposure, and an ion implantation process using the patterned resist as a mask, are repeatedly performed to form ion diffusion regions. Arsenic ions are implanted at an energy of 130 KeV and a dose of $5 \times 10^{13}$ cm$^{-2}$ to form n$^-$-type source and drain regions 4 of the memory transistor. Boron ions are implanted at an energy of 95 KeV and a dose of $1 \times 10^{12}$ cm$^{-2}$ to form a p-type channel region 5 of the selection transistor. Arsenic ions are implanted at an energy of 70 KeV and a dose of $1 \times 10^{12}$ cm$^{-2}$ to form channel regions of depletion type transistors of a peripheral circuit (not shown).

Figure 9A:
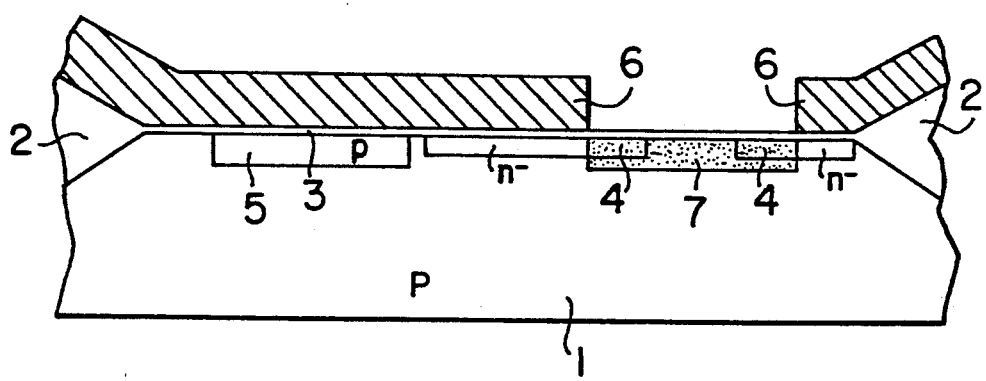
FIGS. 9A to 9D are sectional views illustrating the steps of a method of manufacturing a semiconductor memory device of this invention.

Succeedingly, as shown in FIG. 9A, an ion implantation mask 6 for the channel region of the memory transistor is formed through coating a resist and its patterning. Using the mask 6 and implanting arsenic ions at an energy of 70 KeV and a dose of $1.5 \times 10^{12}$ cm$^{-2}$ and thereafter implanting boron ions at an energy of 95 KeV and a dose of $1 \times 10^{12}$ cm$^{-2}$, the channel region 7 with a controlled threshold value is formed. The arsenic ions are used to form the shallow portion of the channel region, and the boron ions to form the deep portion which prevents occurrence of a short channel effect that punch-through may occur at a short channel length.

It is to be noted that the surface of this channel region becomes a p-type lower in density than that of the selection transistor due to cancellation of the p-type and n-type ions, or becomes an n-type if an effect of n-type ions is strong. In this embodiment, as shown in FIG. 8, the surface of this channel is of an n-type.

Figure 9B:
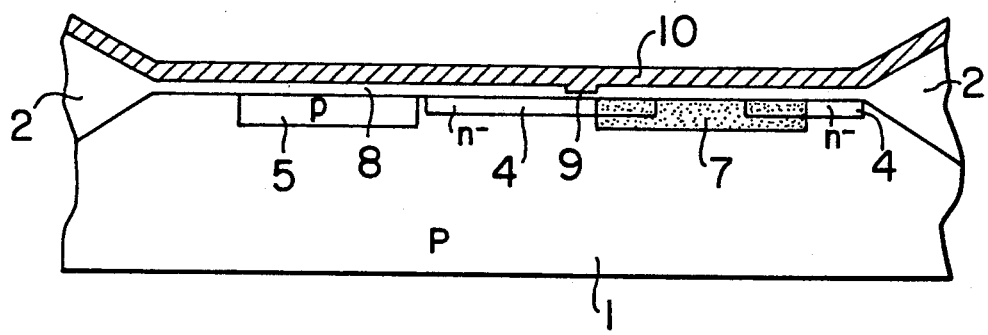

Next, after removing the resist, the device is annealed at 950° C. for 30 minutes under a nitrogen gas atmosphere to remove the sacrificed oxide film 3. Subsequently, the device is oxidized at 900° C. under an oxygen atmosphere containing hydrogen chloride by 10% to form a gate oxide film 8 having a thickness of about 430 angstroms. The gate oxide film is then etched at a desired position to form a thin oxide film of about 90 angstroms serving as a tunnel oxide film 9 (FIG. 9B).

Next, a polysilicon film 10 is deposited to a thickness of about 4000 angstroms by means of a CVD (Chemical Vapor Deposition) method or the like and thereafter, phosphorus is diffused at 900° C. for 60 minutes to make the polysilicon film conductive, using phosphoryl trichloride (POCl$_3$). Then, cell slits (not shown) are formed by a reactive ion etching (RIE).

Figure 9C:
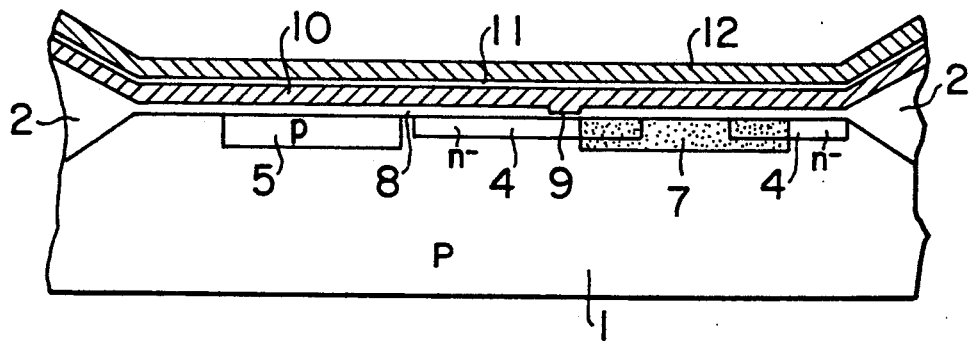

A polysilicon oxide film 11 is then formed to a thickness of about 500 angstroms at 1000° C. under a 50% argon atmosphere. Formed on the polysilicon oxide film 11 is a second gate polysilicon film 12 which is fabricated by depositing polysilicon to a thickness of about 3500 angstroms and making it conductive through phosphorus diffusion at 900° C. for 30 minutes using phosphoryl trichloride (FIG. 9C).

Figure 9D:
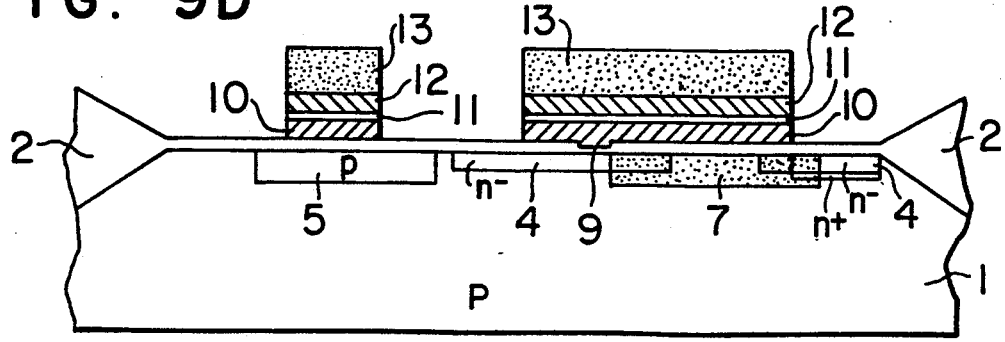

A resist 13 is then coated and subjected to patterning. Using this patterned resist as a mask, the gate electrodes of the memory transistor and the selection transistor are patterned using a RIE method (FIG. 9D). Thus, a semiconductor memory device of this invention is realized.

Next, a low density n-type region for attaining high voltage withstanding is formed by a known method wherein ions are implanted at an energy of 50 KeV and a dose of $1 \times 10^{13}$ cm$^{-2}$, then a high density n-type region for attaining low registivity is formed by a known method wherein ions are implanted at an energy of 40 KeV and a dose of $1 \times 10^{15}$ cm$^{-2}$. A silicon oxide film by a CVD method is then deposited to use it as an interlayer insulating film. After flattening the interlayer insulating film by means of reflow method, contact holes are opened and lead wires are formed by evaporating aluminum and patterning it. For the selection gate constructed of a two-layer structure, the contact is effected with respect to the first polysilicon layer.

The semiconductor memory device is completed by the above-described steps.

In the above embodiment, although the selection gate is constructed of a two-layer structure, it is not necessary to use such structure, but it may be constructed of a single layer structure.

In the above embodiment, the surfaces of the channel regions of the selection transistor and the memory transistor have an opposite conductivity type to each other. However, the surface of the channel region of the memory transistor may be of the same conductivity type with a lower density than that of the selection transistor. For instance, the dose at the channel region surface of the selection transistor may be $1 \times 10^{12}$ cm$^{-2}$, and that of the memory transistor may be $5 \times 10^{11}$ cm$^{-2}$.

Figure 10:
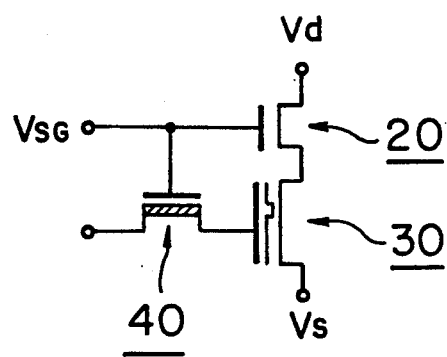
FIG. 10 is a circuit diagram showing a memory cell with a peripheral circuit element.

Further, ions of different conductivity types are diffused respectively for the channel regions of the memory transistor and the selection transistor, thus increasing the number of manufacturing steps. However, arsenic ions are also used for a depletion type transistor 40 of a peripheral circuit shown in FIG. 10 to adjust its threshold voltage so that the increase of manufacturing steps can be avoided if the same conditions are used for both cases. Namely, an ion implantation mask is patterned such that arsenic ions can be implanted at the same time both for adjusting the threshold voltage of the depletion type transistors used in the peripheral circuit and for the memory transistor channel region at the shallow at an energy of 70 KeV and a dose of 1 to $1.5 \times 10^{12}$ cm$^{-2}$.

Furthermore, in the above embodiment, although the channel regions of the memory transistor and the selection transistor are n-channel, they may be p-channel if the conductivity type of all the active regions are inverted.

The characteristics of the semiconductor memory device of this invention are shown in FIG. 5. As seen from the graph, the threshold voltage of the memory transistor is nearly zero and the write and erase characteristics are symmetrical, thus resulting in a large read margin for an erased cell even at a control voltage of 0.

As seen from the detailed description of the embodiment of this invention, the surface of the channel region of the memory transistor is the same conductivity type with a lower density than that of the selection transistor or opposite conductivity. Therefore, without using a higher program voltage, making transistors with high voltage withstanding, thinning the tunnel oxide film or other special measures, it is possible to make threshold voltages after a write operation and an erase operation symmetrically with each other relative to a threshold voltage of 0.

Furthermore, as described previously, there is a tendency that repeated write/erase operations of an EE PROM make the characteristic curves for electron injection and for electron draw-out come near each other. Therefore, a life time of an EE PROM depends on that a read operation particularly for an erased cell becomes ultimately impossible. However, according to this invention, a read margin for an erased cell is large, resulting in a long life time.

What is claimed is:

1. A semiconductor memory device comprising:
    a semiconductor substrate of a first conductivity type;
    a non-volatile memory transistor having a first source region and a first drain region of a second conductivity type which is the opposite type from the first conductivity type, a channel region located between said first source region and said first drain region, a control gate provided over said semiconductor substrate, and a charge storage layer formed between said control gate and said substrate,
    a selection transistor adjacent said memory transistor and having a second drain region of the second conductivity type and a second source region of the second conductivity type, one end of the second source region overlapping with one end of the first drain region,
    means for providing a potential to said first source region independently from a potential of said second drain of said selection transistor,
    wherein the charge condition of said charge storage layer is effected by the tunneling of electrons existing between said first drain region and said charge storage layer,
    the surface of a first channel region of said memory transistor is formed to have the first conductivity type with a lower density than that of said selection transistor or to be of the second conductivity type and,
    said memory transistor determines a threshold value of said memory cell when said selection transistor is in the ON state.

2. The memory device as set forth in claim 1, wherein a first oxide film formed on the first channel region and a second oxide film formed on the second channel region of said selection transistor have the same thickness, and a part of said first oxide film on the first drain region is made thinner than the remaining part.

* * * * *